(12) United States Patent
Katsumura et al.

(10) Patent No.: US 9,391,258 B2
(45) Date of Patent: Jul. 12, 2016

(54) PIEZOELECTRIC ELEMENT

(75) Inventors: Hidenori Katsumura, Hyogo (JP); Hiroshi Kagata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 310 days.

(21) Appl. No.: 13/979,115

(22) PCT Filed: Feb. 9, 2012

(86) PCT No.: PCT/JP2012/000850
§ 371 (c)(1),
(2), (4) Date: Jul. 10, 2013

(87) PCT Pub. No.: WO2012/111279
PCT Pub. Date: Aug. 23, 2012

(65) Prior Publication Data
US 2013/0285512 A1    Oct. 31, 2013

(30) Foreign Application Priority Data

Feb. 18, 2011   (JP) ................. 2011-032801

(51) Int. Cl.
*H01L 41/053*   (2006.01)
*H01L 41/319*   (2013.01)
(Continued)

(52) U.S. Cl.
CPC ............. *H01L 41/053* (2013.01); *C23C 8/18* (2013.01); *C23C 24/10* (2013.01); *C23C 24/106* (2013.01);
(Continued)

(58) Field of Classification Search
CPC ..... H01L 41/053; H01L 41/083; H01L 41/09; H03H 9/1021

USPC .................................................. 310/328, 348
See application file for complete search history.

(56) References Cited

U.S. PATENT DOCUMENTS 4,188,450 A * 2/1980 Greskovich ............. B22C 1/165
106/38.22
5,853,514 A * 12/1998 Takeuchi .............. C04B 35/486
156/89.12
(Continued)

FOREIGN PATENT DOCUMENTS

JP        04-279069       10/1992
JP        2000-119898 A    4/2000
(Continued)

OTHER PUBLICATIONS

Fujiwara et al. "Development of New High-Purity Alumina" Sumitomo Chemical Co., Ltd. Basic Chemicals Research Laboratory, pp. 24-32, 2007-I.
(Continued)

*Primary Examiner* — Derek Rosenau
*Assistant Examiner* — Bryan Gordon
(74) *Attorney, Agent, or Firm* — McDermott Will & Emery LLP

(57) ABSTRACT

A piezoelectric element includes a metal substrate, an alumina layer, a lower electrode, a piezoelectric layer, and an upper electrode. The metal substrate includes iron as a main component and includes at least aluminum and chromium. The alumina layer is formed on the metal substrate, and the lower electrode is formed on the alumina layer. The piezoelectric layer is formed on the lower electrode, and the upper electrode is formed on the piezoelectric layer. The alumina layer is mainly formed of particles in a γ-alumina phase.

9 Claims, 5 Drawing Sheets

(51) Int. Cl.
*H01L 41/08* (2006.01)
*C23C 8/18* (2006.01)
*C23C 24/10* (2006.01)
*C23C 28/00* (2006.01)
*H01L 41/187* (2006.01)
*H01L 41/09* (2006.01)

(52) U.S. Cl.
CPC .............. *C23C 28/321* (2013.01); *C23C 28/345* (2013.01); *H01L 41/0815* (2013.01); *H01L 41/319* (2013.01); *H01L 41/094* (2013.01); *H01L 41/1876* (2013.01)

(56) References Cited

U.S. PATENT DOCUMENTS

| | | | |
|---|---|---|---|
| 7,323,073 B2 | 1/2008 | Minami et al. | |
| 7,495,373 B2* | 2/2009 | Sugahara | B41J 2/14233 310/324 |
| 2002/0024270 A1 | 2/2002 | Yun et al. | |
| 2006/0104895 A1 | 5/2006 | Bauer et al. | |
| 2006/0233698 A1* | 10/2006 | Yen | B82Y 30/00 423/625 |
| 2006/0278907 A1 | 12/2006 | Ishida et al. | |
| 2007/0130740 A1* | 6/2007 | Mita | B41J 2/14233 29/25.35 |
| 2007/0188052 A1 | 8/2007 | Ikeda et al. | |
| 2008/0003131 A1 | 1/2008 | Bauer et al. | |
| 2008/0182128 A1 | 7/2008 | Boy et al. | |
| 2008/0224569 A1 | 9/2008 | Ohashi et al. | |
| 2010/0096666 A1 | 4/2010 | Ishida et al. | |
| 2011/0179867 A1* | 7/2011 | Amemiya | G01C 19/5607 73/504.12 |
| 2011/0189816 A1* | 8/2011 | Kawano | H01L 31/0323 438/95 |

FOREIGN PATENT DOCUMENTS

| | | |
|---|---|---|
| JP | 2002-043644 | 2/2002 |
| JP | 2004-281742 | 10/2004 |
| JP | 2005-193223 | 7/2005 |
| JP | 2006-190720 | 7/2006 |
| JP | 2007-165385 | 6/2007 |
| JP | 2007-227408 A | 9/2007 |
| JP | 2008-504672 A | 2/2008 |
| JP | 2008-520542 A | 6/2008 |
| JP | 2008-227345 A | 9/2008 |
| JP | 2009-016625 A | 1/2009 |
| JP | 2009-130182 | 6/2009 |
| JP | 2009-209413 A | 9/2009 |
| JP | 4403967 B2 | 1/2010 |
| JP | 2010-118447 | 5/2010 |
| WO | WO 03104163 A1 | 12/2003 |
| WO | WO 2006/003342 A1 | 1/2006 |

OTHER PUBLICATIONS

International Search Report issued in International Application No. PCT/JP2012/000850 with Date of mailing Mar. 6, 2012.
The Extended European Search Report dated Sep. 4, 2015 for the related European Patent Application No. 12747660.4.
P.T. Moseley et al., "The Microstructure of the Scale Formed During the High Temperature Oxidation of a Fecralloy Steel", Corrosion Science, vol. 24, No. 6, pp. 547-565, (1984).

* cited by examiner

PIEZOELECTRIC ELEMENT

RELATED APPLICATIONS

This application is the U.S. National Phase under 35 U.S.C. §371 of International Application No. PCT/JP2012/000850, filed on Feb. 9, 2012, which in turn claims the benefit of Japanese Application No. 2011-032801, filed on Feb. 18, 2011, the disclosures of which Applications are incorporated by reference herein.

TECHNICAL FIELD

The present invention relates to a piezoelectric element obtained by forming a piezoelectric ceramics layer on a metal substrate, and it particularly relates to a piezoelectric element suitable for piezoelectric devices such as a piezoelectric actuator and a piezoelectric sensor.

BACKGROUND ART

Piezoelectric material can convert mechanical energy into electrical energy or electrical energy into mechanical energy. A typical example of the piezoelectric material is lead zirconate titanate (Pb(Zr, Ti)$O_3$, hereinafter referred to as PZT) having a perovskite crystal structure. PZT has an extremely excellent piezoelectric property, and has been conventionally used in many electronic components. Also currently, PZT is used as one of main piezoelectric material.

Examples of piezoelectric devices using piezoelectric material such as PZT include a piezoelectric actuator, a piezoelectric sensor, and an inkjet head for a printer. In recent years, in order to carry out microprocessing thereof, technology using MEMS (Micro Electro Mechanical Systems) has been developed actively.

For applying the piezoelectric device using PZT to MEMS, a film of PZT needs to be formed on a substrate as a diaphragm. Examples of a method of forming a film include a sputtering method, a sol-gel method, a MOCVD method, and the like. When such methods are used, piezoelectric films having high quality can be obtained and high-performance piezoelectric property can be expected. On the other hand, in these methods, a film formation speed is slow, and thus, efficient productivity of piezoelectric elements that require a film thickness of 1 μm or more cannot be obtained. Furthermore, as the substrate to be the diaphragm, from the viewpoint of low cost and easy processing, studies using stainless steel substrates are carried out actively.

Recently, as a method of forming a piezoelectric film on such a substrate, an aerosol deposition method (hereinafter, abbreviated as an AD method) has been investigated. The AD method is based on a principle that fine particles are integrated with each other by thermal energy generated by allowing the particles to collide with a substrate at a subsonic speed. With this method, since a piezoelectric film can be formed at a high speed, and, furthermore, the film can be formed with high adhesion because it is anchored to an upper surface layer of the substrate and, further, film can be highly dense.

Patent Literature 1 discloses a piezoelectric film-laminated structure in which PZT having a film thickness of 10 μm or more is formed on a stainless steel substrate by an aerosol deposition method (AD method). This piezoelectric film-laminated structure is formed by forming a diffusion layer by diffusing additive elements contained in the metal substrate onto the metal substrate by heat treatment. Therefore, in this piezoelectric film-laminated structure, adhesion strength is higher and free from peeling or crack as compared with conventional structures.

However, employment of the AD method poses many problems. For example, it is necessary to transport submicron powders by high-pressure air, thus making maintenance difficult. In addition, a vacuum system is required at the time of film formation. From such reasons, the AD method has not been popularized so well.

Furthermore, a piezoelectric layer can be formed by a printing method. The printing method has obtained much attention as "printable electronics," that is, technology for printing electronic components. Furthermore, the printing method does not require a complicated device. Whit this method, film formation time is extremely short even when a film thickness is 10 μm or more, and a necessary amount may be formed to a necessary portion.

However, when a piezoelectric layer is formed in simple equipment by a printing method that is excellent in mass productivity, the piezoelectric layer usually includes 40% to 50% per volume of voids. Therefore, it is necessary to carry out firing at a high temperature so as to increase density. At the time of firing, since a piezoelectric layer is restrained by a substrate, the piezoelectric layer does not contract in the plane direction, but contracts only in the thickness direction of the piezoelectric layer. Therefore, the piezoelectric layer may be peeled off from the substrate due to tensile and compression stress generated between the piezoelectric layer and the substrate. Furthermore, the piezoelectric layer may be peeled off from the substrate by combination of residual stress remaining after firing and vibration occurring when a piezoelectric element is driven.

CITATION LIST

Patent Literature

PL1: Japanese Patent Application Unexamined Publication No. 2007-165385

SUMMARY OF THE INVENTION

The present invention relates to a piezoelectric element including a piezoelectric layer formed on a metal substrate by a printing method, in which adhesion strength at an interface between the metal substrate and the piezoelectric layer is improved.

The piezoelectric element of the present invention includes a metal substrate, an alumina layer, a lower electrode, a piezoelectric layer, and an upper electrode. The metal substrate includes iron as a main component and also includes at least aluminum and chromium. The alumina layer is formed on the metal substrate, and the lower electrode is formed on the alumina layer. The piezoelectric layer is formed on the lower electrode, and the upper electrode is formed on the piezoelectric layer. The alumina layer is mainly formed of particles in a γ-alumina phase.

In this way, when the alumina layer formed on the metal substrate is mainly formed of particles in the γ-alumina phase, when the piezoelectric layer is fired at a high temperature such as approximately 1000° C., the adhesion strength among the metal substrate, the alumina layer, and the piezoelectric layer can be improved. As a result, it is possible to prevent peeling at the interface between the metal substrate and the piezoelectric layer due to vibration at the time at the piezoelectric driving. Furthermore, with the above-mentioned configuration, also when the piezoelectric layer is formed by the printing method, adhesion strength at the interface between the alumina layer and the lower electrode can be improved, thus enabling the peeling at the time of firing to be suppressed.

DETAILED DESCRIPTION OF THE PREFERRED EMBODIMENT

Figure 1:
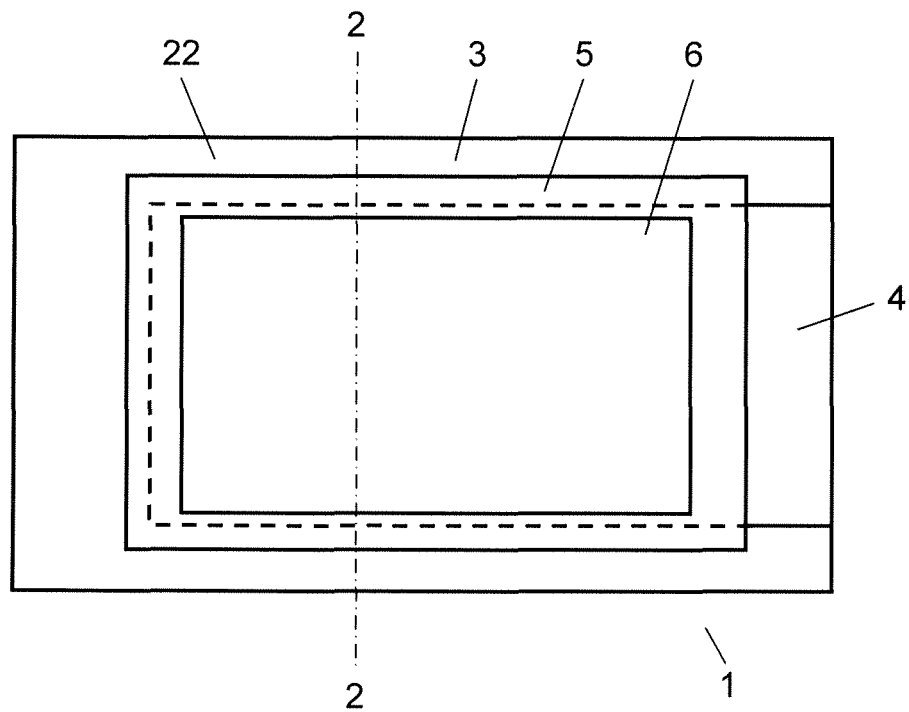
FIG. 1 is a plan view of a piezoelectric element in accordance with an exemplary embodiment of the present invention.
Figure 2:
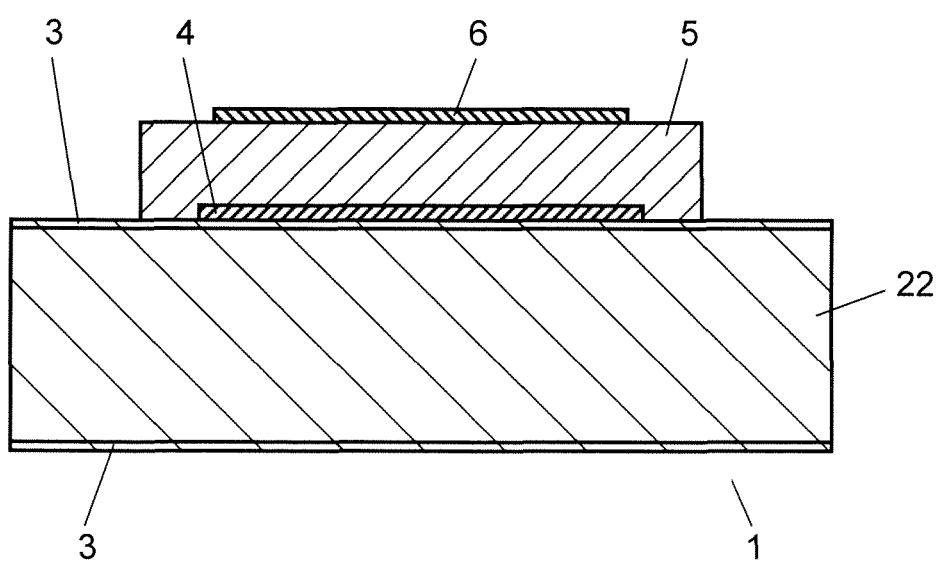
FIG. 2 is a sectional view of the piezoelectric element on line 2-2 shown in FIG. 1.

FIG. 1 is a plan view of piezoelectric element 1 in accordance with an exemplary embodiment of the present invention; FIG. 2 is a sectional view taken on line 2-2 of FIG. 1. Piezoelectric element 1 includes metal substrate 22, alumina layer 3, lower electrode 4, piezoelectric layer 5, and upper electrode 6.

Metal substrate 22 includes iron as a main component and includes at least aluminum and chromium. Alumina layer 3 is formed on metal substrate 22. Note here that principal surfaces (front and rear surfaces) of metal substrate 22 only need to be covered with alumina layer 3, but alumina layer 3 may be formed on the side surface. Lower electrode 4 is formed on alumina layer 3, piezoelectric layer 5 is formed on lower electrode 4, and upper electrode 6 is formed on piezoelectric layer 5. A main phase of alumina that forms alumina layer 3 is a γ-alumina phase. That is to say, alumina layer 3 is formed mainly of particles in the γ-alumina phase. In other words, more than 50 wt. % of material constituting alumina layer 3 includes particles in the γ-alumina phase.

Next, a method of manufacturing piezoelectric element 1 is described. Firstly, alumina layer 3 made of alumina of which main phase is the γ-alumina phase is formed on the surface of metal substrate 22 by heat-treating metal substrate 22 in the atmosphere. Conditions of heat treatment are not particularly limited, but are required such that the entire surface of metal substrate 22 is covered with alumina layer 3 of which main phase is the γ-alumina phase. In this exemplary embodiment, experiments are carried out under heat treatment conditions that metal substrate 22 is maintained in the atmosphere in a temperature range from 850° C. to 950° C. for two hours.

Next, lower electrode 4 is formed by screen-printing Ag—Pd alloy paste on alumina layer 3. Then, piezoelectric layer 5 is formed by metal mask printing paste for printing piezoelectric layer 5 on lower electrode 4. Furthermore, upper electrode 6 is formed by screen printing Ag—Pd alloy paste thereon. The laminated body is fired by keeping it in the atmosphere at 875° C. for two hours, so that piezoelectric element 1 can be produced. After firing, a thickness of piezoelectric layer 5 is, for example, 11 μm, and thicknesses of lower electrode 4 and upper electrode 6 are, for example, 3 μm, respectively.

It is preferable that piezoelectric layer 5 is formed such that it is in contact with alumina layer 3 as shown in FIGS. 1 and 2. Specifically, it is preferable that particles in the γ-alumina phase and piezoelectric layer 5 are in contact with each other. This configuration makes it possible to increase a contact area between the particles in the γ-alumina phase and an upper layer composed of upper electrode 6 and piezoelectric layer 5, and further to improve adhesion strength.

Figure 3:
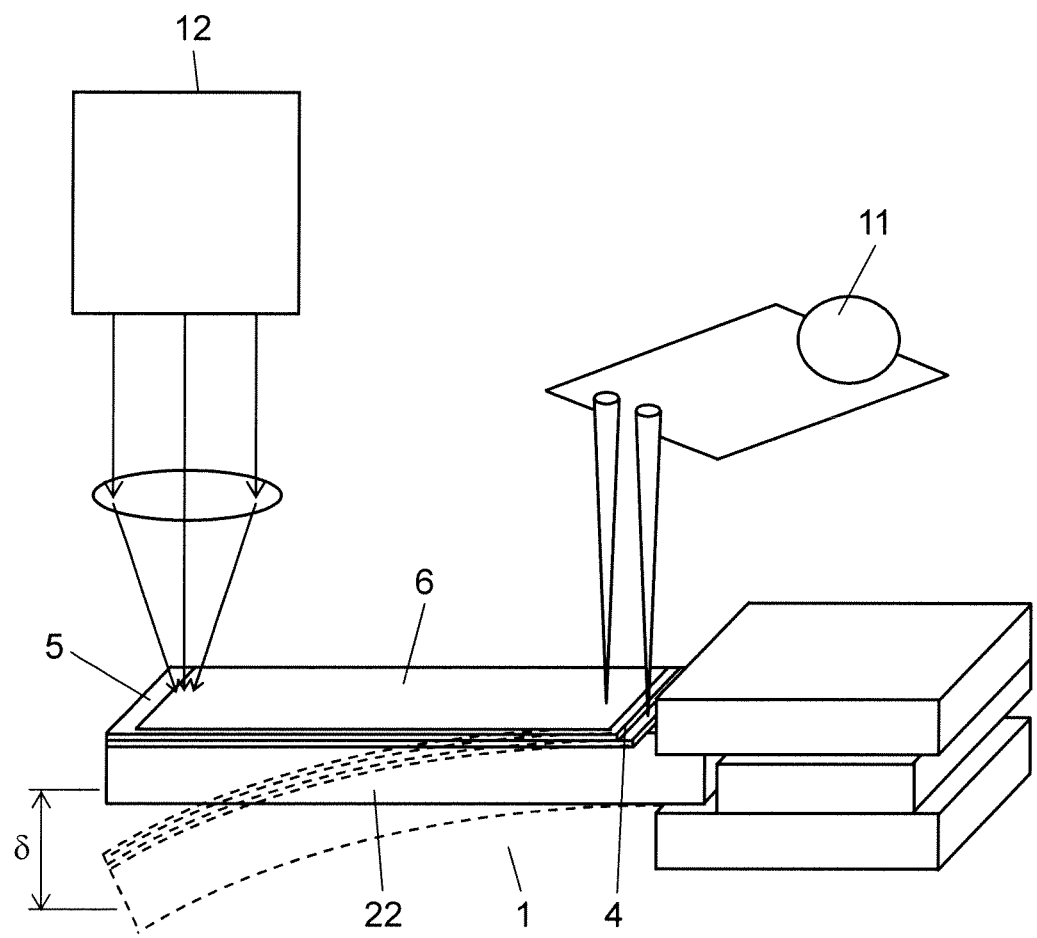
FIG. 3 is a view for illustrating a method of measuring a piezoelectric property.

FIG. 3 shows a method of evaluating a piezoelectric property of piezoelectric element 1. One end of piezoelectric element 1 is fixed, and an AC sinusoidal signal having a frequency of 500 Hz and a voltage of 0-20V is applied between lower electrode 4 and upper electrode 6 by AC power supply 11 so as to vibrate piezoelectric element 1. Then, displacement amount δ of piezoelectric element 1 is measured by using laser Doppler vibrometer 12. Piezoelectric constant $d_{31}$ of piezoelectric layer 5 is calculated from the measured displacement amount δ by using formula (1).

$$d_{31} = \frac{\delta(s_1^2 t_2^4 + 4s_1 s_2 t_1 t_2^3 + 6s_1 s_2 t_1^2 t_2^2 + 4s_1 s_2 t_1^3 t_2 + s_2^2 t_1^4)}{3(s_1 s_2 t_1 (t_1 + t_2) l^2 V)} \quad (1)$$

$t_1$ and $t_2$ respectively indicate thicknesses of metal substrate 22 and piezoelectric layer 5, s1 and s2 indicate elastic compliance, V indicates the applied voltage, and l indicates length from a fixed point of piezoelectric element 1 to a measurement point of displacement amount δ.

It is desirable that piezoelectric material to be used for piezoelectric layer 5 is densely sintered at a low temperature, and has a composition that is excellent in the piezoelectric property. In this exemplary embodiment, piezoelectric material having a composition represented by formula (2) is used for piezoelectric layer 5.

$$Pb_{1.015}Zr_{0.44}Ti_{0.46}(Zn_{1/3}Nb_{2/3})_{0.10}O_{3.015} \quad (2)$$

This composition is in a composition range disclosed in U.S. Pat. No. 4,403,967 proposed by the present applicant, and is known to have an excellent piezoelectric property. The composition is characterized in that a B-site of PZT is substituted with $Pb(Zn_{1/3}Nb_{2/3})O_3$ in 10 mol %, and that a Pb site ratio is 1.015 which is excess as compared with the stoichiometry.

Herein, a method of preparing piezoelectric material powder represented by formula (2) is described. Powders of lead oxide (PbO), titanium oxide ($TiO_2$), zirconium oxide ($ZrO_2$), zinc oxide (ZnO), and niobium oxide ($Nb_2O_5$) having purity of 99.9% or higher are used as raw material. The powders are weighed in the molar ratio represented by formula (2), placed into a pot mill together with pure water and partially stabilized zirconia balls having a diameter of 2 mm as pulverization media, and wet-mixed by rotating the pot mill for 20 hours.

Next, the wet-mixed slurry is transferred to a stainless steel vat or the like, and dried in a dryer chamber at 200° C. for whole day and night. The dried powder is coarsely crushed in a mortar or the like, then the crushed powder is placed into a crucible made of alumina, heat-treated at a maximum temperature of 850° C. for two hours (temperature rising and dropping rate: 200° C./hour) so as to prepare calcined powder.

Next, the calcined powder is coarsely crushed by using a crushing machine such as a rotor mill, a disk mill, or the like. Thereafter, the coarsely crushed powder is wet-pulverized for 50 hours by using a pot mill as in the mixing time. Thereafter, the pulverized slurry is transferred to a stainless steel vat or the like, and dried in a dryer chamber at 200° C. for whole day and night so as to prepare pulverized powder. An average particle diameter ($D_{50}$) of the obtained pulverized powder is, for example, 0.15 µm. As mentioned above, piezoelectric material powder represented by formula (2) can be prepared.

When the obtained pulverized powder is molded into a disk shape and fired, it reaches relative density of 98% or more at 875° C. and is tightly sintered. Firstly, piezoelectric property is determined by using the sintered disk (diameter: 15 mm, thickness: 1 mm).

Silver paste is coated and baked onto the front and rear surfaces of the sintered disk to form an electrode. Then, the sintered disk is subjected to polarization treatment by applying a voltage of 3 kV in silicone oil. Thereafter, resonant frequency and antiresonant frequency of the sintered disk that has undergone polarization treatment are measured by using an impedance analyzer to obtain mechanical coupling coefficient kp. Furthermore, piezoelectric constant $d_{33}^*$ is measured by using a d33 meter (ZJ-3B manufactured by Institute of Acoustics, Chinese Academy of Sciences). For example, the sintered disk formed from the above-mentioned pulverized powder has a mechanical coupling coefficient kp of 0.60 and a piezoelectric constant d33* of 270 pC/N.

Next, a method of producing paste for printing the piezoelectric layer is described. Firstly, an organic vehicle including an organic binder and a solvent at a blending ratio of, for example, 2:8 is prepared. Examples of the organic binder include ethyl cellulose resin, acrylic resin, butyral resin, and the like. Examples of the solvent include α-terpineol, butylcarbitol, and the like. This organic vehicle and the above-mentioned pulverized powder of piezoelectric material are weighed at a weight ratio of, for example, 20:80, and they are mixed together with an appropriate amount of a dispersing agent. Thereafter, the mixture is kneaded by using a three-roll mill to prepare paste for printing the piezoelectric layer.

For formation of lower electrode 4 and upper electrode 6, for example, paste of commercially available silver-palladium alloy (weight ratio of silver to palladium: 90:10; average particle diameter: 0.9 µm) is used. Furthermore, for metal substrate 22, commercially available aluminum-containing ferrite-based stainless steel plate (trade name: NCA-1 manufactured by Nisshin Steel Co., Ltd.; thickness: 0.1 mm) is used. This stainless steel plate includes about 18% of chromium and about 3% of aluminum, and has been conventionally known as a stainless steel plate having high heat resistance. Note here that the contents of chromium and aluminum in metal substrate 22 and compositions of other additives are not particularly limited as long as the property of the stainless steel plate is not largely changed.

A crystal phase of material (particle) constituting alumina layer 3 can be identified by evaluating a surface of fired piezoelectric element 1 on which piezoelectric layer 5 is not formed by using an X-ray diffraction device. The adhesion strength between metal substrate 22 and lower electrode 4 and the adhesion strength between metal substrate 22 and piezoelectric layer 5 are qualitatively evaluated as follows. Piezoelectric element 1 is folded at the center into two parts, and a cross section of the folded part is observed under an optical microscope or SEM. Furthermore, presence of corrosion on the surface of metal substrate 22 is determined by observation under an optical microscope.

Table 1 shows relation between heat treatment temperatures of metal substrate 22 and piezoelectric property; qualitative evaluations of adhesion strength between metal substrate 22 and lower electrode 4 and adhesion strength between metal substrate 22 and piezoelectric layer 5; presence of corrosion on the surface of metal substrate 22; and the crystal phase of material constituting alumina layer 3.

TABLE 1

| Sample No. | Heat treatment temperature (° c.) | Piezoelectric property $d_{31}$ (pm/v) | Evaluation of adhesion strength | Presence of corrosion | Crystal phase of alumina layer |
|---|---|---|---|---|---|
| 1 | 850 | −120 | Not peeled | Partially observed | Only γ-phase |
| 2 | 875 | −125 | Not peeled | Not observed | Only γ-phase |
| 3 | 900 | −120 | Not peeled | Not observed | main: γ-phase secondary: α-phase |
| 4 | 925 | −115 | Partially peeled | Not observed | Equal amount of γ-phase and α-phase |
| 5 | 950 | −95 | Completely peeled | Not observed | main: α-phase secondary: γ-phase |

Figure 4:
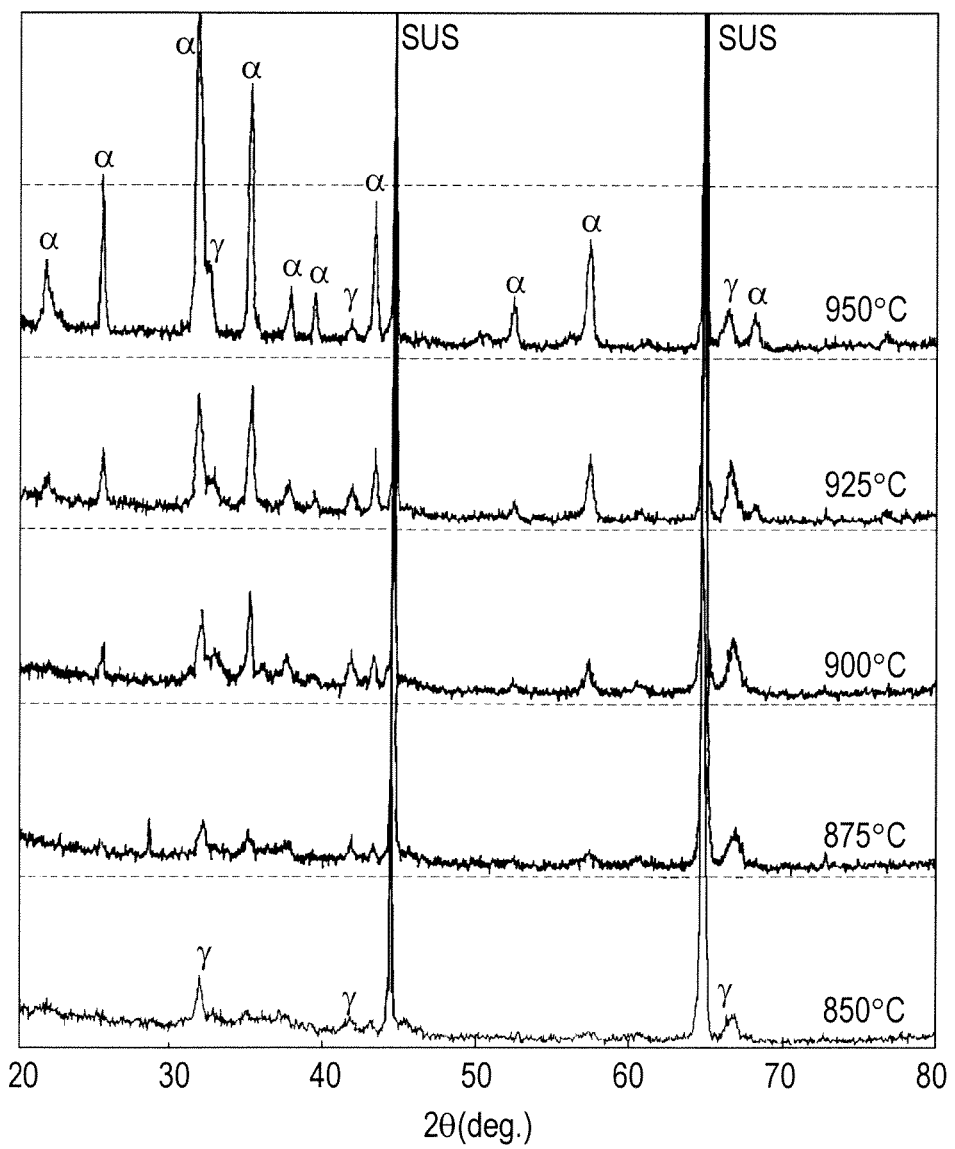
FIG. 4 is a graph showing changes of X-ray diffraction patterns of an alumina layer of the piezoelectric element in accordance with the exemplary embodiment of the present invention.

FIG. 4 is a graph showing changes of X-ray diffraction patterns of alumina layer 3 with respect to heat treatment temperatures of metal substrate 22. A crystal phase of material constituting alumina layer 3 is substantially a single phase of the γ-alumina phase up to the heat treatment temperature of 875° C. However, a small amount of an α-alumina phase is observed at 900° C., and the α-alumina phase is rapidly increased and becomes a main phase at 925° C. or more. Note here that the ratio of the crystal phases of material constituting alumina layer 3 in Table 1 can be specified by comparing areas of peaks specific to each phase shown in FIG. 4.

Figure 5A:
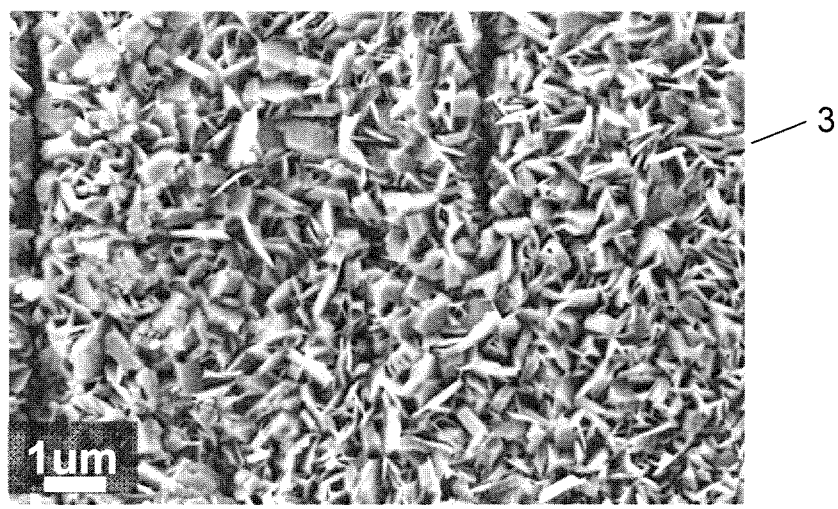
FIG. 5A shows a scanning electron microscope (SEM) observation image of a surface of the alumina layer of the piezoelectric element in accordance with the exemplary embodiment of the present invention.
Figure 5B:
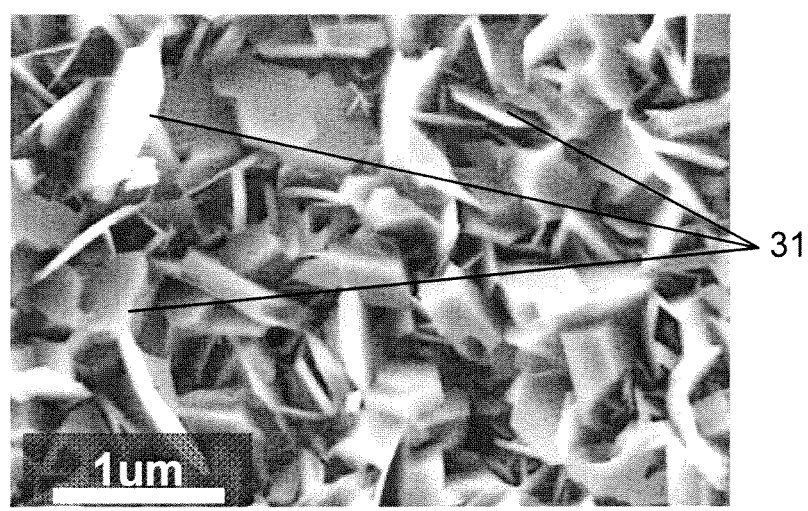
FIG. 5B is an enlarged view of the scanning electron microscope observation image of the surface of the alumina layer shown in FIG. 5A.
Figure 6:
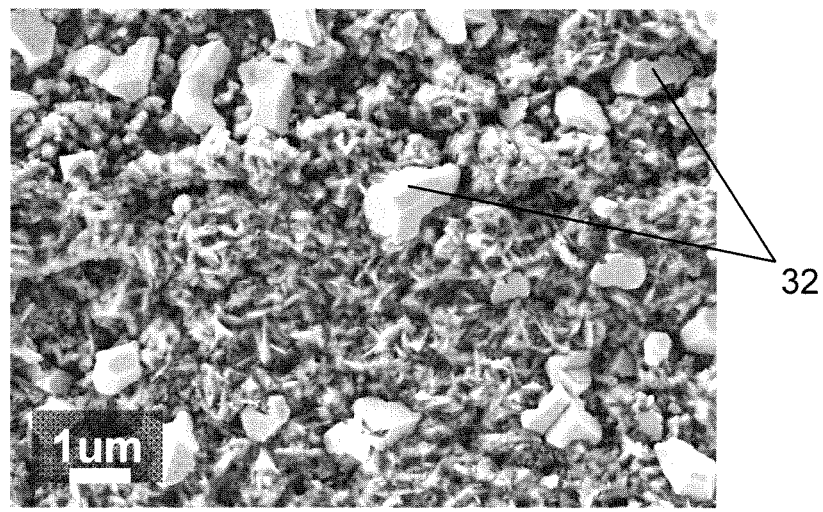
FIG. 6 shows a SEM observation image of a surface of an alumina layer of a piezoelectric element, which is not of the exemplary embodiment of the present invention.

FIG. 5A shows a SEM observation image of alumina layer 3 observed from the upper surface when the heat treatment temperature is 875° C.; FIG. 5B is an enlarged view of FIG. 5A. FIG. 6 shows a SEM observation image of the alumina layer observed from the upper surface when the heat treatment temperature is 950° C. Herein, from the observation of FIG. 5A in which the main component is particles in the γ-alumina phase and the heat treatment temperature is 875° C., the surface of alumina layer 3 is covered with scale-shaped particles.

As shown in FIG. 5B, scale-shaped particles 31 is present on the surface of alumina layer 3. The maximum diameter of a flat surface of scale-shaped particle 31 is about 1 µm in a case of large particle, and the thickness is about 10 nm to 50 nm. That is to say, in this example, scale-shaped particle 31 satisfies the aspect ratio of 10 or more and 50 or less.

On the other hand, scale-shaped particle 31 is hardly observed on the surface of the alumina layer shown in FIG. 6. Instead, granular particles 32 are observed. The maximum particle diameter of granular particles 32 is about 1 µm. When the results of the X-ray diffraction analysis shown in FIG. 4 are taken into account together, it is presumed that scale-shaped particle 31 is a γ-alumina particle, and granular particle 32 is an α-alumina particle.

It is presumed that depending upon firing conditions such as firing atmosphere and firing temperatures, the shapes and the particle diameters of scale-shaped particles 31 and granular particles 32 are different from those mentioned above. Alumina layer 3 exhibiting an effect in this exemplary embodiment has a configuration in which the main phase is the γ-alumina phase. That is to say, alumina layer 3 is mainly formed of particles in the γ-alumina phase. In more preferable configuration, the surface of alumina layer 3 is covered with scale-shaped particles 31. As described above, it is preferable that the particles in the γ-alumina phase have a scale shape. Thus, a contact area between alumina layer 3 and lower electrode 4 can be increased, and the adhesion strength can be further improved.

As shown in Table 1, piezoelectric property $d_{31}$ of piezoelectric element 1 is −115 to −125 pm/V, which is substantially constant with measurement error considered, at a heat treatment temperature of 850° C. or higher and 925° C. or lower, but it is −95 pm/V, which is apparently lowered, at 950° C.

Furthermore, from the evaluation of adhesion strength between metal substrate 22 and lower electrode 4 and between metal substrate 22 and piezoelectric layer 5, interlayer peeling is not found even at a microscopic level at heat treatment temperature of 850° C. or higher and 900° C. or lower. On the other hand, peeling is observed in a part at the heat treatment temperature of 925° C., and peeling is observed on the entire surface at the heat treatment temperature of 950° C. According to detailed observation, peeling occurs between alumina layer 3 and lower electrode 4. Therefore, in the conditions of this exemplary embodiment, the heat treatment temperature is required to be 850° C. or higher and 900° C. or lower. Furthermore, the deterioration of the piezoelectric property mentioned above seems to occur because the adhesion strength between alumina layer 3 and lower electrode 4 is reduced, so that vibration generated in piezoelectric layer 5 cannot be sufficiently propagated to metal substrate 22.

In the case that the heat treatment temperature is 875° C. at which the main phase of alumina layer 3 is the γ-alumina phase, the surface of alumina layer 3 is covered with scale-shaped particles 31 as shown in FIG. 5A. Therefore, it seems that a contact area between alumina layer 3 and lower electrode 4 is increased, and thus the adhesion strength is enhanced. On the other hand, in the case that the heat treatment temperature is 950° C. at which the main phase of alumina layer 3 is the α-alumina phase, granular particles 32 are formed and scale-shaped particles 31 disappear as shown in FIG. 6. Accordingly, it seems that a contact area between alumina layer 3 and lower electrode 4 is reduced and the adhesion strength is lowered. Furthermore, the crystallinity of the γ-alumina phase is lower than that of the α-alumina phase, so that it seems that adhesion strength with respect to lower electrode 4 becomes higher in terms of the material property.

As mentioned above, the crystal phase of alumina layer 3 is preferably the γ-alumina phase for developing excellent piezoelectric properties, and achieving high adhesion strength among metal substrate 22, alumina layer 3, and lower electrode 4. That is to say, alumina layer 3 may be formed of particles in the γ-alumina phase. Furthermore, it is further preferable that a large number of scale-shaped protrusions are formed on the surface of alumina layer 3.

As shown in Table 1, corrosion on the surface of metal substrate 22 is found only when the heat treatment temperature is 850° C. The corrosion occurs because a lead oxide component evaporated at the time of firing piezoelectric layer 5 and an iron component of metal substrate 22 are brought into contact with each other, and local cell reaction occurs due to a difference in ionization tendency, so that lead oxide is changed into metallic lead and iron is changed into iron oxide. It is presumed that in the conditions that heat treatment temperature is 850° C., formation of alumina layer 3 by heat treatment is not sufficient, and a part of the iron component of metal substrate 22 is exposed. On the other hand, when heat treatment temperature is 875° C. or higher, since alumina layer 3 covers an entire surface of metal substrate 22, the corrosion phenomenon is suppressed. Thus, it is preferable that alumina layer 3 covers the entire surface of the principal surface of metal substrate 22. However, the thickness of alumina layer 3 is not particularly limited.

Figure 7:
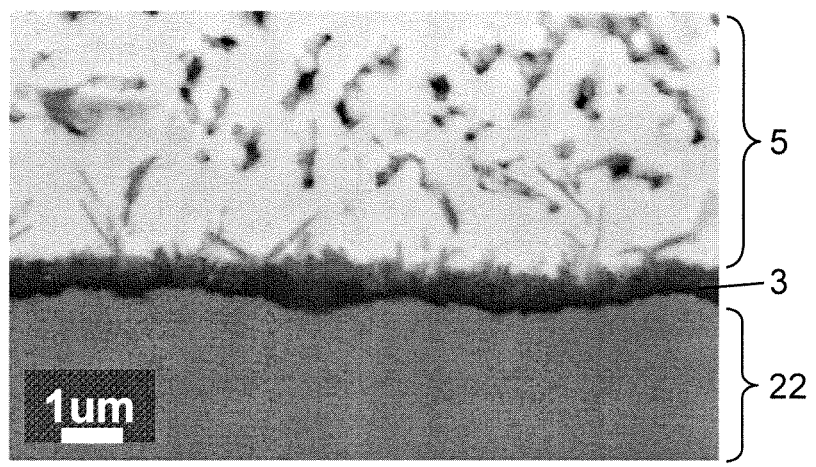
FIG. 7 shows a SEM observation image of a cross section of interfaces among a metal substrate, an alumina layer, and a piezoelectric layer of the piezoelectric element in accordance with the exemplary embodiment of the present invention.

FIG. 7 shows a SEM observation image of a cross section at the interfaces of metal substrate 22, alumina layer 3, and piezoelectric layer 5 when the heat treatment temperature is 875° C. The surface of alumina layer 3 has scale-shaped protrusions formed of particles in the γ-alumina phase, and the protrusions are embedded in piezoelectric layer 5. Therefore, adhesion strength is more improved. Furthermore, a part in which the protrusions are embedded of piezoelectric layer 5 is denser and adhesion strength is further improved as compared with a part in which the protrusions are not embedded.

According to observation results shown in FIG. 7, when the heat treatment temperature is 875° C., the thickness of alumina layer 3 is about 0.5 µm.

Furthermore, although not shown in the drawings, scale-shaped protrusions are embedded in lower electrode 4 also at the interface between alumina layer 3 and lower electrode 4. In this way, it is preferable that at least a part of scale-shaped particles 31 in the γ-alumina phase is embedded in lower electrode 4. Furthermore, when scale-shaped particles 31 in the γ-alumina phase and piezoelectric layer 5 are in contact with each other, it is preferable that at least a part of particles 31 is embedded also in piezoelectric layer 5. With such a configuration, strong anchor can be formed and thus the adhesion strength can be improved.

Note here that alumina layer 3 formed by heat-treating metal substrate 22 is thermally stable, and has excellent mechanical strength. Therefore, as mentioned above, alumina layer 3 has a diffusion preventing effect of preventing thermal diffusion at the time of firing so as to prevent deterioration of the piezoelectric property in addition to an effect of improving the adhesion strength with respect to the upper and lower layers.

In this exemplary embodiment, alumina layer 3 mainly including particles in the γ-alumina phase is formed by heat-treatment of metal substrate 22 at 850° C. or higher and 900° C. or lower, then piezoelectric layer 5 is formed by firing at 875° C. Furthermore, from the viewpoint of corrosion, it is preferable that metal substrate 22 is heat-treated at 875° C. or higher and 900° C. or lower. In this way, by making the firing temperature equal to or lower than the heat treatment temperature, it is possible to prevent particles in the γ-alumina phase formed by heat treatment from undergoing phase transition and being changed into particles in the α-alumina phase at the time of firing. Therefore, it is possible to prevent the above-mentioned effect from being lost at the time of firing. That is to say, firing is carried out at a temperature at which the γ-alumina phase can be maintained, and thereby both the particles of the γ-alumina phase and piezoelectric layer 5 can be formed by firing simultaneously. Therefore, it is preferable that material is selected such that the firing temperature is equal or lower than the heat treatment temperature and conditions other than temperatures are adjusted.

INDUSTRIAL APPLICABILITY

The present invention is useful to be used in small devices which are used in, for example, piezoelectric actuators, piezoelectric sensors, and inkjet heads for a printer.

The invention claimed is:

1. A piezoelectric element comprising:
a metal substrate including iron as a main component, and including at least aluminum and chromium;
an alumina layer formed on the metal substrate;
a lower electrode formed directly on the alumina layer;
a piezoelectric layer formed on the lower electrode; and
an upper electrode formed on the piezoelectric layer,
wherein the alumina layer is formed mainly of particles in a γ-alumina phase.

2. The piezoelectric element according to claim 1, wherein the alumina layer and the piezoelectric layer are in contact with each other.

3. The piezoelectric element according to claim 2, wherein each one of the particles in the γ-alumina phase is a scale-shaped particle.

4. The piezoelectric element according to claim 3, wherein at least a part of the scale-shaped particles in the γ-alumina phase is embedded in the lower electrode and the piezoelectric layer.

5. The piezoelectric element according to claim 1, wherein each one of the particles in the γ-alumina phase is a scale-shaped particle.

6. The piezoelectric element according to claim 5, wherein at least a part of the scale-shaped particles in the γ-alumina phase is embedded in the lower electrode.

7. The piezoelectric element according to claim 1, wherein the particles in the γ-alumina phase have protrusions, and at least a part of the protrusions is embedded in the lower electrode.

8. The piezoelectric element according to claim 7, wherein each protrusion has a length ranging from 0.5 μm to 1 μm, inclusive.

9. The piezoelectric element according to claim 2, wherein the particles in the γ-alumina phase have protrusions, and at least a part of the protrusions is embedded in the piezoelectric layer.

* * * * *